United States Patent
Sato

(10) Patent No.: US 11,233,225 B2
(45) Date of Patent: Jan. 25, 2022

(54) ORGANIC LIGHT EMITTING DIODE DISPLAY DEVICE

(71) Applicant: LG Display Co., Ltd., Seoul (KR)

(72) Inventor: Osamu Sato, Tokyo (JP)

(73) Assignee: LG Display Co., Ltd., Seoul (KR)

( * ) Notice: Subject to any disclaimer, the term of this patent is extended or adjusted under 35 U.S.C. 154(b) by 64 days.

(21) Appl. No.: 15/990,201

(22) Filed: May 25, 2018

(65) Prior Publication Data

US 2018/0342693 A1 Nov. 29, 2018

(30) Foreign Application Priority Data

May 26, 2017 (JP) .............................. JP2017-104185

(51) Int. Cl.
*H01L 51/52* (2006.01)
*H01L 51/00* (2006.01)
*H01L 27/32* (2006.01)

(52) U.S. Cl.
CPC ........ *H01L 51/529* (2013.01); *H01L 51/0097* (2013.01); *H01L 51/5256* (2013.01); *H01L 51/5278* (2013.01); *H01L 27/322* (2013.01); *H01L 27/3244* (2013.01); *H01L 2251/5338* (2013.01); *H01L 2251/568* (2013.01)

(58) Field of Classification Search
CPC ....................................................... H01L 51/50
See application file for complete search history.

(56) References Cited

U.S. PATENT DOCUMENTS

| 7,250,721 B2 | 7/2007 | Menda | |
| 8,736,162 B2 | 5/2014 | Jin et al. | |
| 9,448,592 B2 | 9/2016 | Jin et al. | |
| 10,054,988 B2 | 8/2018 | Jin et al. | |
| 10,528,084 B2 | 1/2020 | Jin et al. | |
| 2005/0206832 A1* | 9/2005 | Tahara | G02F 1/1334 349/182 |
| 2005/0285521 A1 | 12/2005 | Menda | |
| 2013/0002133 A1 | 1/2013 | Jin et al. | |
| 2013/0003389 A1* | 1/2013 | Moroishi | C08F 265/06 362/311.01 |
| 2014/0247405 A1 | 9/2014 | Jin et al. | |
| 2014/0319497 A1* | 10/2014 | Oho | C09J 7/10 257/40 |

(Continued)

FOREIGN PATENT DOCUMENTS

| JP | 2005-019082 A | 1/2005 |
| JP | 2006-004781 A | 1/2006 |

(Continued)

OTHER PUBLICATIONS

Japan Patent Office, Office Action, JP Patent Application No. 2017-104185, dated Feb. 24, 2021, eight pages.

(Continued)

*Primary Examiner* — Wasiul Haider
(74) *Attorney, Agent, or Firm* — Fenwick & West LLP

(57) ABSTRACT

A display device includes: a substrate; a thin film transistor on the substrate; a first electrode, a light emitting diode and a second electrode sequentially on the thin film transistor; a barrier layer on the second electrode, the barrier layer including at least one organic layer; and a front film on the barrier layer, wherein the at least one organic layer includes a chemically self-healing material.

34 Claims, 3 Drawing Sheets

(56) References Cited

U.S. PATENT DOCUMENTS

| | | | |
|---|---|---|---|
| 2015/0221895 A1* | 8/2015 | Sato | H01L 51/5234 257/40 |
| 2015/0270323 A1* | 9/2015 | Oho | H01L 27/3272 257/40 |
| 2015/0376356 A1 | 12/2015 | Ryu et al. | |
| 2016/0320803 A1* | 11/2016 | Oh | B32B 27/08 |
| 2016/0365522 A1* | 12/2016 | Seo | H01L 51/56 |
| 2016/0369956 A1* | 12/2016 | Park | F21K 9/68 |
| 2016/0370827 A1 | 12/2016 | Jin et al. | |
| 2017/0008998 A1* | 1/2017 | Sodano | C08G 18/0895 |
| 2017/0092897 A1* | 3/2017 | Liu | H01L 51/5256 |
| 2017/0309867 A1* | 10/2017 | Mun | C09J 133/066 |
| 2018/0059485 A1* | 3/2018 | Nam | G02F 1/133617 |
| 2018/0081399 A1* | 3/2018 | Kwon | G06F 1/1652 |
| 2018/0136536 A1* | 5/2018 | Kim | G02F 1/134309 |
| 2018/0171055 A1* | 6/2018 | Kushner | C08F 293/005 |
| 2018/0282484 A1* | 10/2018 | Woo | C08G 77/14 |
| 2019/0004569 A1 | 1/2019 | Jin et al. | |
| 2019/0023860 A1* | 1/2019 | Kim | C08J 7/04 |
| 2019/0058160 A1* | 2/2019 | Kishimoto | H01L 27/3276 |
| 2019/0250318 A1* | 8/2019 | Jeong | C09J 175/14 |
| 2019/0359764 A1* | 11/2019 | Pan | H01L 51/0059 |
| 2020/0142448 A1 | 5/2020 | Jin et al. | |

FOREIGN PATENT DOCUMENTS

| | | |
|---|---|---|
| JP | 2006-108077 A | 4/2006 |
| JP | 2009-117079 A | 5/2009 |
| JP | 2013-015835 A | 1/2013 |
| JP | 2014-058606 A | 4/2014 |
| JP | 2014-063147 A | 4/2014 |

OTHER PUBLICATIONS

Japan Patent Office, Notice of Reasons for Refusal, JP Patent Application No. 2017-104185, dated Aug. 10, 2021, ten pages.

Japan Patent Office, Office Action, JP Patent Application No. 2017-104185, dated Nov. 30, 2021, eight pages.

\* cited by examiner

ORGANIC LIGHT EMITTING DIODE DISPLAY DEVICE

CROSS-REFERENCE TO RELATED APPLICATION

This application claims the benefit of Japanese Patent Application No. 2017-104185, filed on May 26, 2017, in the Japan Patent Office, which is incorporated herein by reference in its entirety.

BACKGROUND

Technical Field

The present disclosure relates to a display device, touch display device, and more particularly, to an organic light emitting diode display device including a self-healing material.

Description of the Background

An organic display element of an organic light emitting diode display device has a disadvantage that an emission property is deteriorated according to a time elapse. An oxygen and a moisture may permeate the organic display element to deteriorate an organic layer and an electrode, thereby an emission property deteriorated. As a result, various means such as a sealant for blocking contact of the organic display element with an oxygen and a moisture are provided.

For example, in a Japanese Patent Publication No. 2005-019082, an organic light emitting diode display device including an organic display element between first and second glass substrates and a sealing layer on a side surface of the organic display element is suggested. The sealing layer has a thickness corresponding to a low oxygen permeability and a low moisture permeability.

In a Japanese Patent Publication No. 2009-117079, an organic light emitting diode display device where a cross-sectional surface of a contact line contacting an electrode and a surface of the contact line and an emission element are covered with a gas barrier layer of silicon nitride or silicon oxynitride is suggested.

In a Japanese Patent Publication No. 2014-063147, an organic light emitting diode display device including a pixel part having an organic light emitting element between first and second substrates facing each other, a first sealant of resin surrounding a perimeter of the pixel part and a second sealant of metal contacting at least one of side surfaces of the first and second substrates and filling a gap between the first and second substrates is suggested.

In general, a barrier layer has a lamination structure of an inorganic layer/an organic layer. However, when the barrier layer has a crack, an electrode of an organic display element may be broken due to permeation of an oxygen and a moisture.

Specifically, a crack and permeation of an oxygen and a moisture may remarkably occur in an organic display panel of plastic, i.e., a flexible organic display panel such as a bendable panel, a rollable panel and a foldable panel.

SUMMARY

Aspects of the present disclosure relate to an organic display element where an organic layer includes a self-healing material.

One or more aspects of the present disclosure relate to an organic display element where permeation of an oxygen and a moisture and deterioration of an emission property are prevented by an organic layer including a self-healing material even when a barrier layer has a crack.

Advantages and features of the disclosure will be set forth in part in the description, which follows and in part will become apparent to those having ordinary skill in the art upon examination of the following or may be learned from practice of the disclosure. Other advantages and features of the aspects herein may be realized and attained by the structure particularly pointed out in the written description and claims hereof as well as the appended drawings.

It is to be understood that both the foregoing general description and the following detailed description are explanatory, and are intended to provide further explanation of the aspects as claimed.

BRIEF DESCRIPTION OF THE DRAWINGS

The accompanying drawings, which are included to provide a further understanding of the disclosure, are incorporated in and constitute a part of this specification, illustrate implementations of the disclosure and together with the description serve to explain the principles of aspects of the disclosure.

In the drawings.

DETAILED DESCRIPTION

Figure 1:
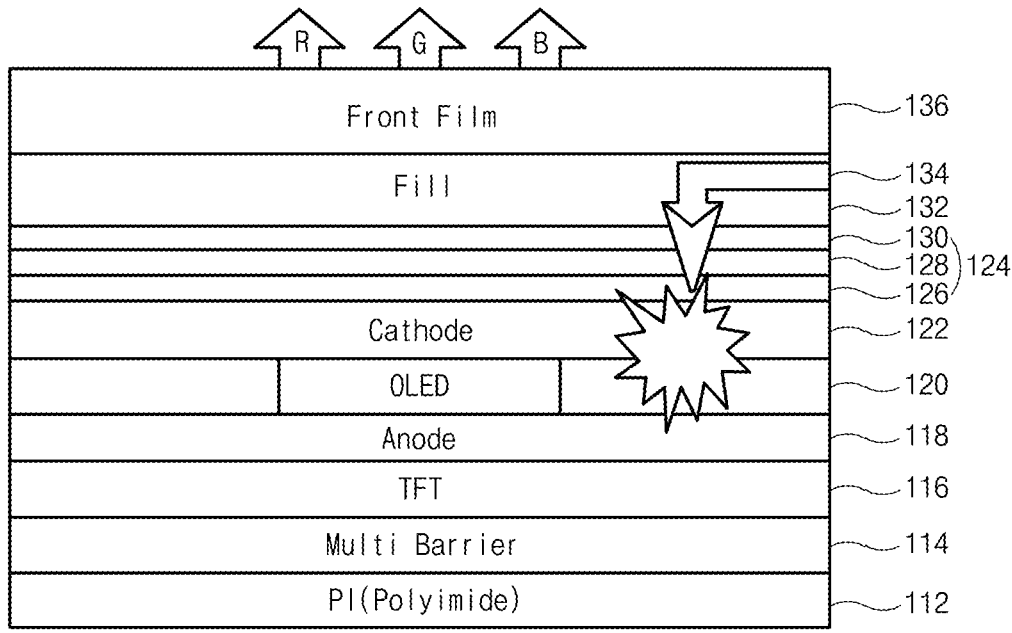
FIG. 1 is a cross-sectional view showing an organic display element according to a first embodiment of the present disclosure.

Reference will now be made in detail to aspects of the present disclosure, examples of which are illustrated in the accompanying drawings. In the following description, when a detailed description of well-known functions or configurations related to this document is determined to unnecessarily cloud a gist of an aspect of the disclosure, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a certain order. Like reference numerals designate like elements throughout. Names of the respective elements used in the following explanations are selected only for convenience of writing the specification and may be thus different from those used in actual products.

FIG. 1 is a cross-sectional view showing an organic display element according to a first embodiment of the present disclosure.

In FIG. 1, an organic display element 110 includes a substrate 112, a multiple barrier 114, a thin film transistor (TFT) 116, a first electrode 118, an organic light emitting diode (OLED) 120, a second electrode 122, a barrier layer 124, a filler layer 132 and a front film 136. The substrate 112 may include a coloring polyimide (PI). The first and second electrodes 118 and 122 may be an anode and a cathode, respectively. The OLED 120 may include a single organic emitting layer. Alternatively, the OLED 120 may include at least two organic emitting layers such that the OLED 120 has a tandem structure.

The barrier layer 124 may include a first inorganic layer 126, an organic layer 128 and a second inorganic layer 130. The organic layer 128 may include one of acrylic resin and epoxy resin. The first and second inorganic layers 126 and 130 may include one of silicon oxide ($SiO_2$) and silicon nitride (SiNx). The barrier layer 124 and the filler layer 132 may be referred to as an encapsulation layer.

When water/oxygen, i.e., a moisture and/or an oxygen 134 permeate the barrier layer 124 through a crack (inverted triangle), the OLED 120 and the first and second electrodes 118 and 122 may be broken. To prevent the break, the organic layer 128 of the barrier layer 124 and/or the filler layer 132 include a chemically self-healing material. For example, a layer contacting the first and second inorganic layers 126 and 130 may include the chemically self-healing material.

Figure 2:
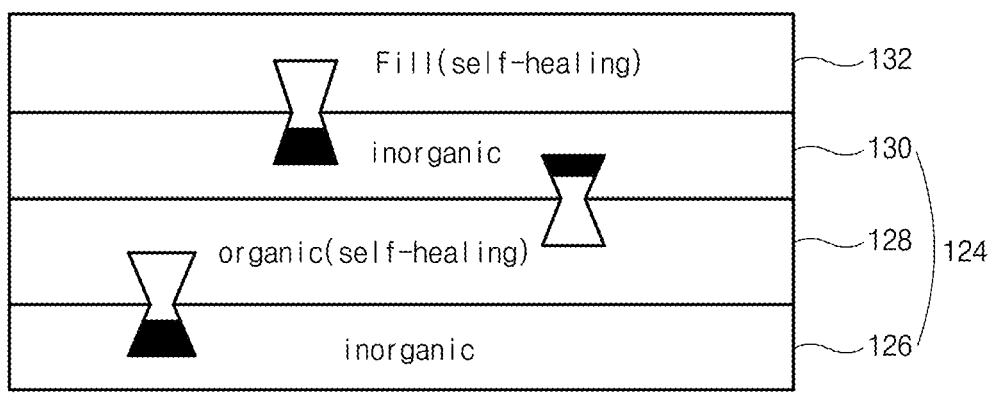
FIG. 2 is a cross-sectional view showing a mechanism of preventing extension of a crack due to a self-healing material in a barrier layer and a filler layer of an organic display element according to the first embodiment of the present disclosure.

FIG. 2 is a cross-sectional view showing a mechanism of preventing extension of a crack due to a self-healing material in a barrier layer and a filler layer of an organic display element according to a first embodiment of the present disclosure.

In FIG. 2, the organic layer 128 includes a chemically self-healing material where a chemical reaction is initiated by an impact/a stress of a crack generation. As a result, a whole or a part of a crack generated in the first and second inorganic layers 126 and 130 is filled with the chemically self-healing material and the extension of a crack is prevented. In addition, the filler layer 132 includes the chemically self-healing material. The filler layer 132 may include an epoxy resin.

The chemical reaction may be accelerated by a heat of the OLED 120 turned on. However, if a healing is finished before the moisture and/or the oxygen 134 (of FIG. 1) reach the crack, the moisture and/or the oxygen 134 do not permeate the barrier layer 124. For example, when the crack is healed within several hours to several days, permeation of the moisture and/or the oxygen 134 may be prevented.

For example, the chemically self-healing material may have a combination of a polymerizable monomer and a polymerization initiator. The polymerizable monomer may include an acrylic monomer, an epoxy monomer or a combination thereof.

For example, the acrylic monomer may include one of methyl (meth)acrylate, ethyl (meth)acrylate, n-propyl (meth)acrylate, isopropyl (meth)acrylate, n-butyl (meth)acrylate, isobutyl (meth)acrylate, sec-butyl (meth)acrylate, tert-butyl (meth)acrylate, n-pentyl (meth)acrylate, isoamyl (meth)acrylate, n-hexyl (meth)acrylate, 2-methylpentyl (meth)acrylate, n-octyl (meth)acrylate, 2-ethylhexyl (meth) acrylate, n-decyl (meth)acrylate, n-dodecyl (meth)acrylate, n-octadecyl (meth)acrylate, isobornyl (meth)acrylate, cyclohexyl (meth)acrylate, phenyl (meth)acrylate and benzyl (meth)acrylate.

In addition, the polymerization initiator for the acrylic monomer may include a radical polymerization initiator. The radical polymerization initiator may include a water soluble compound, a fat soluble compound or an azo compound. For example, the radical polymerization initiator may include one of persulfate such as sodium persulfate, potassium persulfate and ammonium persulfate, hydroperoxide such as t-butyl hydroperoxide, hydrogen peroxide, ketone peroxide such as methylethylketone peroxide and cyclohexanone peroxide, dialkyl peroxide such as di-t-butyl peroxide and t-butyl cumyl peroxide and 2-2'-azobis(2-methylpropionamidine)dihydrochloride. The self-healing material may include one kind of the radical polymerization initiator of peroxide group or at least two kinds of the radical polymerization initiator of peroxide group.

Although a composition ratio of the radical polymerization initiator is not limited, the radical polymerization initiator may have a composition ratio of about 0.1 wt % to about 15 wt %, specifically about 0.5 wt % to about 10 wt % based on a total weight of all monomers of acrylic polymer. When the composition ratio of the radical polymerization initiator is greater than about 0.1 wt %, a polymerization rate increases. When the composition ratio of the radical polymerization initiator is smaller than about 15 wt %, a stability of the polymer is improved. As a result, the radical polymerization initiator in a dispersant may have an excellent property.

For example, the epoxy monomer may include one of allyl glycidyl ether, 1,2:3,4-diepoxybutane, butyl glycidyl ether, 1,2-butylene oxide, 1,4-butanediol diglycidyl ether, glycidyl 4-tert-butylbenzoate, 2,2-bis(4-glycidyloxyphenyl)propane, tert-butyl blycidyl ether, benzyl glycidyl ether, 9,9-bis(4-glycidyloxyphenyl)fluorene, 4-tert-butylphenyl glycidyl ether, 2-biphenylyl glycidyl ether, diglycidyl 1,2-cyclohexanedicarboxylate, 1,7-octadiene diepoxide, 1,2-epoxydodecane, diethoxy(3-glycidyloxypropyl)methylsilane, 2,4-dibromophenyl glycidyl ether, 2,2'-(2,2,3,3,4,4,5,5,6,6,7,7-dodecafluorooctane-1,8-diyl)bis(oxirane), epibromohydrin, epichlorohydrin, styrene oxide, propylene oxide, 1,2-epoxyoctane, 2-ethylhexyl glycidyl ether, 1,2-epoxyeicosane, 1,2-epoxyheptane, 1,2-epoxyoctadecane, 1,2-epoxytetradecane, 1,2-epoxydecane, 1,2-epoxyhexadecane, 2-(3,4-epoxycyclohexyl)ethyltrimethoxysilane, 1,3-butadiene monoepoxide, ethylene glycol diglycidyl ether, 1,2-epoxy-5-hexene, 1,2-epoxy-9-decene, 1,2-epoxy-1H,1H,2H,3H,3H-heptadecafluoroundecane, ethyl glycidyl ether, 1,2-epoxycyclopentane, 2,3-epoxynorbornane, 3,4-epoxytetrahydrofuran, 1,2-epoxypentane, 1,2-epoxy-4-vinylcyclohexane, glycidyl phenyl ether, glycidyl methyl ether, 3-glycidyloxypropyltrimethoxysilane, glycidyl isopropyl ether, 3-glycidyloxypropyl(dimethoxy)methylsilane, 4-glycidyloxycarbazole, glycidyl 2-methoxyphenyl ether, glycidyl propargyl ether, glycidyl lauryl ether, [8-(glycidyloxy)-n-octyl]trimethoxysilane, 1,5-hexadiene diepoxide, 1,1,1,3,5,5,5-heptamethyl-3-(3-glycidyloxypropyl)trisiloxane, triglycidyl isocyanurate, glycidyl methacrylate, 4,4'-methylenebis(N,N-diglycidylaniline), neopentyl glycol diglycidyl ether, 2,2,3,3,4,4,5,5,5-nonafluoropentyloxirane, 1,2-epoxycyclohexane, 2,2'-(2,2,3,3,4,4,5,5-octafluorohexane-1,6-diyl)bis(oxirane), polyethylene glycol glycidyl lauryl ether, glycidyl stearate, triethoxy(3-glycidyloxypropyl)silane and 2,2,3,3,4,4,5,5,6,6,7,7,7-tridecafluoroheptyloxirane.

In addition, the polymerization initiator for the epoxy monomer may include a positive ion polymerization initiator.

The radical polymerization initiator may include a water soluble compound, a fat soluble compound or an azo compound. For example, the positive ion polymerization initiator may include a photocatalyst ionic salt of a complex negative ion including a halogen of a metal or a metalloid, an onium positive ion and an organic metal complex positive ion. The positive ion polymerization initiator may include one of atoms of fifteenth, sixteenth and seventeenth groups which correspond to VA, VIA and VIIA groups. Specifically, the positive ion polymerization initiator may include an adduct of a positive ion and a negative ion of an aromatic organic atom such as phosphorus, antimony, bismuth, sulfur, nitrogen and iodine. For example, the positive ion polymerization initiator may include an onium slat such as an aromatic diazonium salt, an aromatic iodonium salt and an aromatic sulfonium salt.

For example, the onium salt sold as a photoacid generator may be Optomer-SP-150, Optomer-SP-151, Optomer-SP-170, Optomer-SP-171 (ADEKA), UVE-1014 (General Electric Company), IRGACURE-261 (Ciba-Geigy), San-Aid SI-60L, San-Aid SI-80L, UVI-6990 (Union carbide), BBI-103, MPI-103, TPS-103, MDS-103, DTS-103, NAT-103, NDS-103 (Midori Kagaku Co., Ltd.), San-Aid SI-100L (SANSHIN CHEMICAL INDUSTRY CO., LTD.), CI-2064, CI-2639, CI-2624, CI-2481 (NIPPON SODA CO., LTD.), RHODORSIL PHOTOINITIATOR 2074 (Rhone-Poulenc), CD-1012 (Sartomer), CPI-110P and CPI110A (San-Apro Ltd.). Optomer-SP-170 may easily obtain an effective curing property, and RHODORSIL PHOTOINITIATOR 2074 may have a relatively small amount of ionic impurities.

In addition, the initiator sold as a heat acid generator may be San-Aid SI-60L, San-Aid SI-80L, San-Aid SI-100L, San-Aid SI-110L and San-Aid SI-180L (SANSHIN CHEMICAL INDUSTRY CO., LTD.).

The polymerization initiator may be used solely or at least two kinds of the polymerization initiator may be used. Further, a sensitizer such as an anthracene group and a thioxanthene group may be used with the polymerization initiator.

Although a composition ratio of the polymerization initiator is not limited, the polymerization initiator may have a composition ratio of about 0.1 weight part to about 10 weight part with respect to about 100 weight part of an epoxy monomer. When the composition ratio of the polymerization initiator is smaller than about 0.1 weight part, the epoxy monomer may not be sufficiently polymerized. When the composition ratio of the polymerization initiator is greater than about 10 weight part, an amount of an acid generated from the positive ion polymerization initiator exceeds an amount required for reaction of a polymerization compound. For example, the polymerization initiator may have a composition ratio of about 0.3 weight part to about 5 weight part with respect to about 100 weight part of an epoxy monomer.

In addition, the chemically self-healing material may include a self-healing polymer gel using a dynamic covalent bond due to a reversible dissociation to an arylbibenzofuranone radical of diarylbenzofuranone (DABBF).

The chemically self-healing material may include a high functioning polymer material using a reversible reaction due to Diels-Aler reaction of furan and maleimide.

The chemically self-healing material may include a complete self-healing system using a Host-Guest mutual reaction due to cyclodextrin.

A molecule of a polymer adjacent to a micro crack may be used as the chemically self-healing material. When the molecule of the polymer is diffused to fill the generated crack, permeation of an oxygen and a moisture is prevented.

The molecule of the polymer may include a molecule of a thermoplastic polymer without three-dimensional cross-linking. One kind of a thermoplastic material or a blend material including at least one kind of a thermoplastic material may be used for the organic layer 128 contacting the first and second inorganic layers 126 and 130 having the crack.

Figure 3:
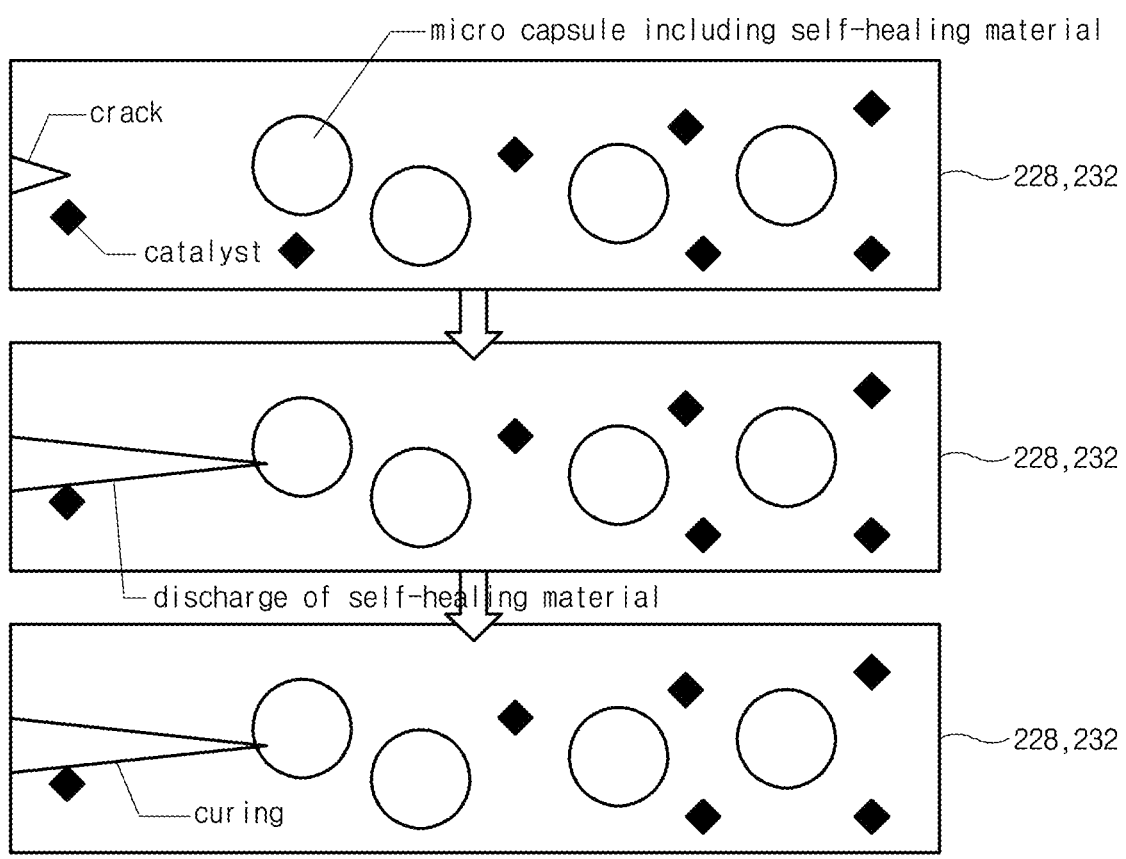
FIG. 3 is a cross-sectional view showing a mechanism of preventing extension of a crack due to a micro capsule of a barrier layer of an organic display element according to a second embodiment of the present disclosure.

FIG. 3 is a cross-sectional view showing a mechanism of preventing extension of a crack due to a micro capsule of a barrier layer of an organic display element according to a second embodiment of the present disclosure.

In FIG. 3, first and second organic layers 228 and 232 of a barrier layer of an organic display element include a micro capsule. For example, when the polymerizable monomer is used as the chemically self-healing material, the micro capsule may include both of the polymerizable monomer and the polymerization initiating catalyst. Alternatively, the micro capsule may include one of the polymerizable monomer and the polymerization initiating catalyst and the first and second organic layers 228 and 232 may include the other of the polymerizable monomer and the polymerization initiating catalyst.

The polymerizable monomer is discharged from the micro capsule due to an impact/a reaction of a crack generation, and the chemically self-healing material fills a whole or a part of the crack to be cured. As a result, extension of the crack is prevented, and permeation of a moisture and an oxygen is prevented. A black point generation due to defect of the barrier layer is prevented, and a lifetime of the organic display element is improved.

When the crack is generated, the deterioration such as the black point is not caused immediately. Instead, when the moisture and the oxygen reach the OLED and the electrodes through the crack, the deterioration is caused. Accordingly, if a healing is finished before the moisture and/or the oxygen reach the crack, the moisture and/or the oxygen do not permeate the barrier layer. For example, when the crack is healed within several hours to several days, permeation of the moisture and the oxygen may be prevented.

In addition, the chemical reaction may be accelerated by a heat of the OLED turned on. The healed first and second organic layers 228 and 232 may prevent extension of the crack and a time where the moisture and the oxygen reach the OLED and the electrodes may be delayed by the healed first and second organic layers 228 and 232 as well as the inorganic layer.

Although the polymerizable monomer is used as the chemically self-healing material in the micro capsule in FIG. 3, the polymerizable monomer and the polymerization initiating catalyst may be divided by a phase separation.

Figure 4:
FIG. 4 is a cross-sectional view showing a barrier layer of an organic display element according to a third embodiment of the present disclosure.
Figure 5:
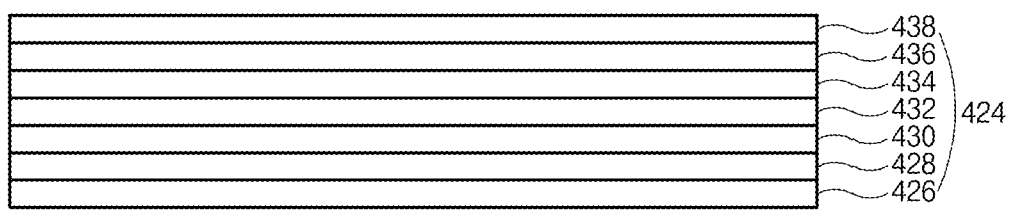
FIG. 5 is a cross-sectional view showing a barrier layer of an organic display element according to a fourth embodiment of the present disclosure.

FIG. 4 is a cross-sectional view showing a barrier layer of an organic display element according to a third embodiment of the present disclosure, and FIG. 5 is a cross-sectional view showing a barrier layer of an organic display element according to a fourth embodiment of the present disclosure.

The barrier layer 124 includes the first inorganic layer 126/the organic layer 128/the second inorganic layer 130 in FIGS. 1 and 2. A barrier layer 324 includes a first inorganic layer 326/a first organic layer 328/a second inorganic layer 330/a second organic layer 332/a third inorganic layer 334 in FIG. 4, and a barrier layer 424 includes a first inorganic layer 426/a first organic layer 428/a second inorganic layer 430/a second organic layer 432/a third inorganic layer 434/a third organic layer 436/a fourth inorganic layer 438 in FIG. 5.

Figure 6:
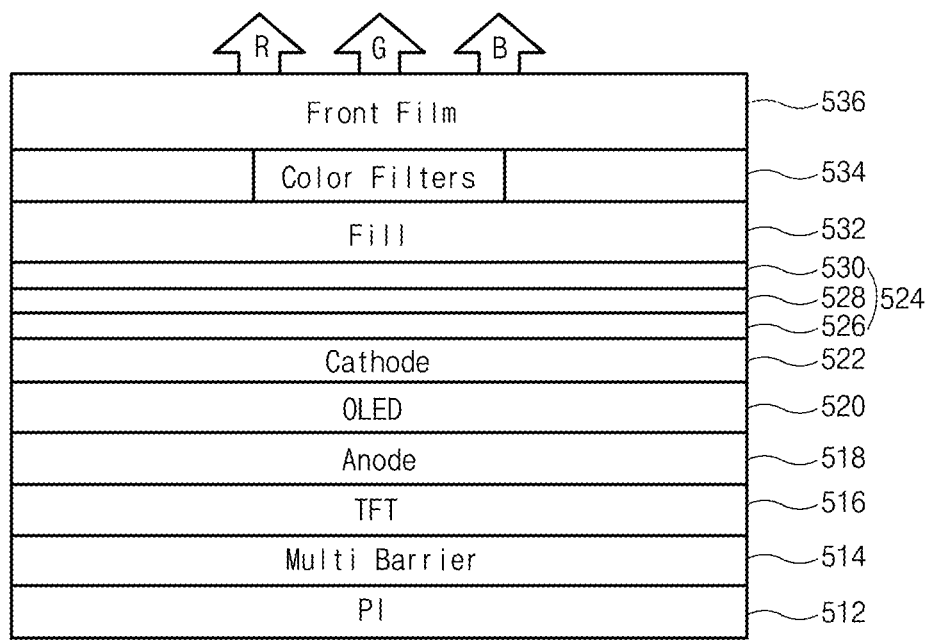
FIG. 6 is a cross-sectional view showing an organic display element according to a fifth embodiment of the present disclosure.

FIG. 6 is a cross-sectional view showing an organic display element according to a fifth embodiment of the present disclosure.

The organic display element 110 has a division coloring type, and the OLED 120 of the organic display element 110 includes red, green and blue emitting layers in FIG. 1. In FIG. 6, an organic display element 510 includes a substrate 512, a multiple barrier 514, a thin film transistor (TFT) 516, a first electrode 518, an organic light emitting diode (OLED) 520, a second electrode 522, a barrier layer 524, a filler layer 532, a color filter layer 534 and a front film 536. The substrate 512 may include a coloring polyimide (PI). The first and second electrodes 518 and 522 may be an anode and a cathode, respectively.

The barrier layer 524 may include a first inorganic layer 526, an organic layer 528 and a second inorganic layer 530. The organic layer 528 may include one of acrylic resin and epoxy resin. The first and second inorganic layers 526 and 530 may include one of silicon oxide ($SiO_2$) and silicon nitride (SiNx).

When water/oxygen, i.e., a moisture and/or an oxygen permeate the barrier layer 524 through a crack, the OLED 520 and the first and second electrodes 518 and 522 may be broken. To prevent the break, the organic layer 528 of the barrier layer 524 and/or the filler layer 532 include a chemically self-healing material. For example, a layer contacting the first and second inorganic layers 526 and 530 may include the chemically self-healing material.

The organic display element 510 has a color filter type, and the OLED 520 includes a white emitting layer. The OLED 520 may include a single organic emitting layer. Alternatively, the OLED 520 may include at least two organic emitting layers such that the OLED 520 has a tandem structure. A white light of the OLED 520 has a color through the color filter layer 534. Although the color filter layer 534 is disposed between the filler layer 532 and the front film 536 in FIG. 6, the color filter layer 534 may be disposed between the OLED 520 and a surface of the front film 536. In addition, the color filter layer 534 may be disposed between the OLED 520 and the substrate 512 in another embodiment where an organic display element has a bottom emission type.

Consequently, since an organic layer of a barrier layer and/or a filler layer includes a chemically self-healing material, permeation of an oxygen and a moisture is prevented even when a crack is generated in the barrier layer. As a result, an organic display element where an emission property is not reduced is provided.

The organic display element may be applied to a bottom emission type as well as a top emission type. In addition, the organic display element may be applied to a flexible display panel as well as a rigid display panel. The flexible display panel may include a bendable panel, a rollable panel and a foldable panel. The flexible display panel may further include a display panel where a part such as an ending portion is bendable and foldable.

The present disclosure also relates to and is not limited to the following aspects.

In the present disclosure, the light emitting diode includes a single organic emitting layer.

In the present disclosure, the light emitting diode includes at least two organic emitting layers having a tandem structure.

In the present disclosure, a color filter layer is disposed between the filler layer and the front film, or between the organic light emitting diode and the substrate.

In the present disclosure, the barrier layer has a lamination structure including an inorganic layer and an organic layer alternatively arranged.

In the present disclosure, the display device substrate is flexible.

In the present disclosure, the display device includes a bendable panel, a rollable panel and a foldable panel.

In the present disclosure, the display device includes at least one bending portion in the substrate.

In the present disclosure, the at least one bending portion includes the chemically self-healing material.

In the present disclosure, the at least one organic layer includes one kind of a thermoplastic material or a blend material including at least one kind of a thermoplastic material.

In the present disclosure, the chemically self-healing material includes a polymerizable monomer and a polymerization initiator.

In the present disclosure, the polymerizable monomer includes one of an acrylic monomer, an epoxy monomer and a combination thereof.

In the present disclosure, the polymerization initiator for the polymerizable monomer of the acrylic monomer includes a radical polymerization initiator.

In the present disclosure, the polymerization initiator for the polymerizable monomer of the epoxy monomer includes a positive ion polymerization initiator.

In the present disclosure, a display device comprises: a substrate; a thin film transistor on the substrate; a first electrode, a light emitting diode and a second electrode sequentially on the thin film transistor; an encapsulation layer on the second electrode, the encapsulation layer including at least one organic layer; wherein the at least one organic layer includes a chemically self-healing material.

In the present disclosure, a front film is disposed on the encapsulation layer.

In the present disclosure, a color filter layer is disposed between the encapsulation layer and the front film, or between the organic light emitting diode and the substrate.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A display device, comprising:
    a substrate;
    a thin film transistor on the substrate;
    a first electrode, a light emitting diode and a second electrode sequentially on the thin film transistor;
    a barrier layer on the second electrode, the barrier layer including at least one organic layer,
        wherein the at least one organic layer includes a chemically self-healing material, the chemically self-healing material including a self-healing polymer gel including diarylbenzofuranone (DABBF) that reversibly dissociates to an arylbibenzofuranone radical due to a dynamic covalent bond,
        wherein the chemically self-healing material includes a polymerizable monomer and a polymerization initiator, and
        wherein the polymerizable monomer includes an acrylic monomer and the polymerization initiator includes a radical polymerization initiator having a composition ratio of 0.1 wt % to 15 wt %.

2. The display device of claim 1, further comprising a front film on the barrier layer.

3. The display device of claim 2, further comprising a filler layer between the barrier layer and the front film, wherein the filler layer includes the chemically self-healing material.

4. The display device of claim 3, further comprising: a color filter layer between the filler layer and the front film, or between the light emitting diode and the substrate.

5. The display device of claim 1, wherein the light emitting diode includes a single organic emitting layer.

6. The display device of claim 1, wherein the light emitting diode includes at least two organic emitting layers having a tandem structure.

7. The display device of claim 1, further comprising:
a multi barrier between the substrate and the thin film transistor.

8. The display device of claim 1, wherein the barrier layer has a lamination structure including an inorganic layer and an organic layer alternately arranged.

9. The display device of claim 1, wherein the chemically self-healing material is disposed in a micro capsule.

10. The display device of claim 1, wherein the at least one organic layer includes a polymerization initiating catalyst.

11. The display device of claim 1, wherein the display device is flexible.

12. The display device of claim 11, wherein the display device includes a bendable panel, a rollable panel and a foldable panel.

13. The display device of claim 11, wherein the display device includes at least one bending portion in the substrate.

14. The display device of claim 13, wherein the at least one bending portion includes the chemically self-healing material.

15. The display device of claim 1, wherein the at least one organic layer includes one kind of a thermoplastic material or a blend material including at least one kind of a thermoplastic material.

16. The display device of claim 1, wherein the acrylic monomer includes one of methyl (meth)acrylate, ethyl (meth)acrylate, n-propyl (meth)acrylate, isopropyl (meth)acrylate, n-butyl (meth)acrylate, isobutyl (meth)acrylate, sec-butyl (meth)acrylate, tert-butyl (meth)acrylate, n-pentyl (meth)acrylate, isoamyl (meth)acrylate, n-hexyl (meth)acrylate, 2-methylpentyl (meth)acrylate, n-octyl (meth)acrylate, 2-ethylhexyl (meth)acrylate, n-decyl (meth)acrylate, n-dodecyl (meth)acrylate, n-octadecyl (meth)acrylate, isobornyl (meth)acrylate, cyclohexyl (meth)acrylate, phenyl (meth)acrylate and benzyl (meth)acrylate, and
wherein the radical polymerization initiator includes one of sodium persulfate, potassium persulfate, ammonium persulfate, t-butyl hydroperoxide, hydrogen peroxide, methylethylketone peroxide, cyclohexanone peroxide, di-t-butyl peroxide, t-butyl cumyl peroxide and 2-T-azobis(2-methylpropionamidine)dihydrochloride.

17. The display device of claim 1, wherein the polymerizable monomer and the polymerization initiator are divided by a phase separation.

18. The display device of claim 1, wherein the barrier layer further includes first and second inorganic layers and the at least one organic layer is disposed between the first and second inorganic layers, and wherein a crack generated in the first and second inorganic layers is filled with the chemically self-healing material of the at least one organic layer.

19. The display device of claim 1, wherein a chemical reaction of the chemically self-healing material is initiated by an impact and a stress of a generation of a crack.

20. A display device, comprising:
a substrate;
a thin film transistor on the substrate;
a first electrode, a light emitting diode, and a second electrode sequentially on the thin film transistor;
a barrier layer on the second electrode, the barrier layer including at least one organic layer,
wherein the at least one organic layer includes a chemically self-healing material, the chemically self-healing material including a self-healing polymer gel including diarylbenzofuranone (DABBF) that reversibly dissociates to an arylbibenzofuranone radical due to a dynamic covalent bond,
wherein the chemically self-healing material includes a polymerizable monomer and a polymerization initiator, and
wherein the polymerizable monomer includes an epoxy monomer and the polymerization initiator includes a positive ion polymerization initiator having a composition ratio of 0.1 weight part to 10 weight part with respect to 100 weight part of the epoxy monomer.

21. The display device of claim 20, wherein the epoxy monomer includes one of allyl glycidyl ether, 1,2:3,4-diepoxybutane, butyl glycidyl ether, 1,2-butylene oxide, 1,4-butanediol diglycidyl ether, glycidyl 4-tert-butylbenzoate, 2,2-bis(4-glycidyloxyphenyl)propane, tert-butyl blycidyl ether, benzyl glycidyl ether, 9,9-bis(4-glycidyloxyphenyl)fluorene, 4-tert-butylphenyl glycidyl ether, 2-biphenylyl glycidyl ether, diglycidyl 1,2-cyclohexanedicarboxylate, 1,7-octadiene diepoxide, 1,2-epoxydodecane, diethoxy(3-glycidyloxypropyl)methylsilane, 2,4-dibromophenyl glycidyl ether, 2,2'-(2,2,3,3,4,4,5,5,6,6,7,7-dodecafluorooctane-1,8-diyl)bis(oxirane), epibromohydrin, epichlorohydrin, styrene oxide, propylene oxide, 1,2-epoxyoctane, 2-ethylhexyl glycidyl ether, 1,2-epoxyeicosane, 1,2-epoxyheptane, 1,2-epoxyoctadecane, 1,2-epoxytetradecane, 1,2-epoxydecane, 1,2-epoxyhexadecane, 2-(3,4-epoxycyclohexyl)ethyltrimethoxysilane, 1,3-butadiene monoepoxide, ethylene glycol diglycidyl ether, 1,2-epoxy-5-hexene, 1,2-epoxy-9-decene, 1,2-epoxy-1H,1H,2H,3H,3H-heptadecafluoroundecane, ethyl glycidyl ether, 1,2-epoxycyclopentane, 2,3-epoxynorbornane, 3,4-epoxytetrahydrofuran, 1,2-epoxypentane, 1,2-epoxy-4-vinylcyclohexane, glycidyl phenyl ether, glycidyl methyl ether, 3-glycidyloxypropyltrimethoxysilane, glycidyl isopropyl ether, 3-glycidyloxypropyl(dimethoxy)methylsilane, 4-glycidyloxycarbazole, glycidyl 2-methoxyphenyl ether, glycidyl propargyl ether, glycidyl lauryl ether, [8-(glycidyloxy)-n-octyl]trimethoxysilane, 1,5-hexadiene diepoxide, 1,1,1,3,5,5,5-heptamethyl-3-(3-glycidyloxypropyl)trisiloxane, triglycidyl isocyanurate, glycidyl methacrylate, 4,4'-methylenebis(N,N-diglycidylaniline), neopentyl glycol diglycidyl ether, 2,2,3,3,4,4,5,5,5-nonafluoropentyloxirane, 1,2-epoxycyclohexane, 2,2'-(2,2,3,3,4,4,5,5-octafluorohexane-1,6-diyl)bis(oxirane), polyethylene glycol glycidyl lauryl ether, glycidyl stearate, triethoxy(3-glycidyloxypropyl)silane and 2,2,3,3,4,4,5,5,6,6,7,7,7-tridecafluoroheptyloxirane, and
wherein the positive ion polymerization initiator includes one of an aromatic diazonium salt, an aromatic iodonium salt and an aromatic sulfonium salt.

22. A display device, comprising:
a substrate;

a thin film transistor on the substrate;

a first electrode, a light emitting diode and a second electrode sequentially on the thin film transistor;

an encapsulation layer on the second electrode, the encapsulation layer including at least one organic layer, wherein the at least one organic layer includes a chemically self-healing material, the chemically self-healing material including a self-healing polymer gel including diarylbenzofuranone (DABBF) that reversibly dissociates to an arylbibenzofuranone radical due to a dynamic covalent bond, wherein the chemically self-healing material includes a polymerizable monomer and a polymerization initiator, and wherein the polymerizable monomer includes an acrylic monomer and the polymerization initiator includes a radical polymerization initiator having a composition ratio of 0.1 wt % to 15 wt %.

23. The display device of claim 22, further comprising a front film on the encapsulation layer.

24. The display device of claim 23, further comprising: a color filter layer between the encapsulation layer and the front film, or between the organic light emitting diode and the substrate.

25. The display device of claim 22, wherein the light emitting diode includes a single organic emitting layer.

26. The display device of claim 22, wherein the light emitting diode includes at least two organic emitting layers having a tandem structure.

27. The display device of claim 22, further comprising: a multi barrier between the substrate and the thin film transistor.

28. The display device of claim 22, wherein the chemically self-healing material is disposed in a micro capsule.

29. The display device of claim 22, wherein the at least one organic layer includes a polymerization initiating catalyst.

30. The display device of claim 22, wherein the display device is flexible.

31. The display device of claim 30, wherein the display device includes a bendable panel, a rollable panel and a foldable panel.

32. The display device of claim 30, wherein the display device includes at least one bending portion in the substrate.

33. The display device of claim 32, wherein the at least one bending portion includes the chemically self-healing material.

34. A display device, comprising:

a substrate;

a thin film transistor on the substrate;

a first electrode, a light emitting diode and a second electrode sequentially on the thin film transistor;

a barrier layer on the second electrode, the barrier layer including at least one organic layer, wherein the at least one organic layer includes a chemically self-healing material, and wherein the chemically self-healing material includes a self-healing polymer gel including diarylbenzofuranone (DABBF) that reversibly dissociates to an arylbibenzofuranone radical due to a dynamic covalent bond.

* * * * *